(12) United States Patent
Lin

(10) Patent No.: US 11,152,529 B2
(45) Date of Patent: Oct. 19, 2021

(54) SEMICONDUTOR PACKAGE STRUCTURES AND METHODS OF MANUFACTURING THE SAME

(71) Applicant: Advanced Semiconductor Engineering, Inc., Kaohsiung (TW)

(72) Inventor: Jr-Wei Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/709,631

(22) Filed: Dec. 10, 2019

(65) Prior Publication Data

US 2021/0175385 A1 Jun. 10, 2021

(51) Int. Cl.
| | | |
|---|---|---|
| *H01L 31/00* | (2006.01) | |
| *H01L 31/153* | (2006.01) | |
| *H01L 31/0203* | (2014.01) | |
| *H01L 31/18* | (2006.01) | |
| *H01L 23/00* | (2006.01) | |

(52) U.S. Cl.
CPC ............ *H01L 31/153* (2013.01); *H01L 24/05* (2013.01); *H01L 24/13* (2013.01); *H01L 31/0203* (2013.01); *H01L 31/18* (2013.01); *H01L 2224/02371* (2013.01); *H01L 2224/02372* (2013.01)

(58) Field of Classification Search
CPC ......... H01L 24/13; H01L 24/05; H01L 24/11; H01L 24/97; H01L 24/73; H01L 2224/02371; H01L 2224/02372; H01L 2224/00014; H01L 2224/00; H01L 31/153; H01L 31/0203; H01L 31/18
See application file for complete search history.

(56) References Cited

U.S. PATENT DOCUMENTS

| | | | | |
|---|---|---|---|---|
| 9,209,156 | B2 * | 12/2015 | Len | ..................... H01L 25/0657 |
| 2008/0157316 | A1 * | 7/2008 | Yang | ...................... H01L 24/97 257/685 |
| 2019/0207051 | A1 * | 7/2019 | Utsumi | ................... H01L 33/52 |

* cited by examiner

*Primary Examiner* — Nikolay K Yushin
(74) *Attorney, Agent, or Firm* — Foley & Lardner LLP

(57) ABSTRACT

A semiconductor package structure includes a first semiconductor device and a second semiconductor device. The first semiconductor device includes a substrate and a circuit. The substrate has a first portion and a second portion. A first thickness of the first portion is greater than a second thickness of the second portion. The circuit is disposed on the second portion of the substrate. The second semiconductor device is disposed on the circuit of the first semiconductor device.

19 Claims, 14 Drawing Sheets

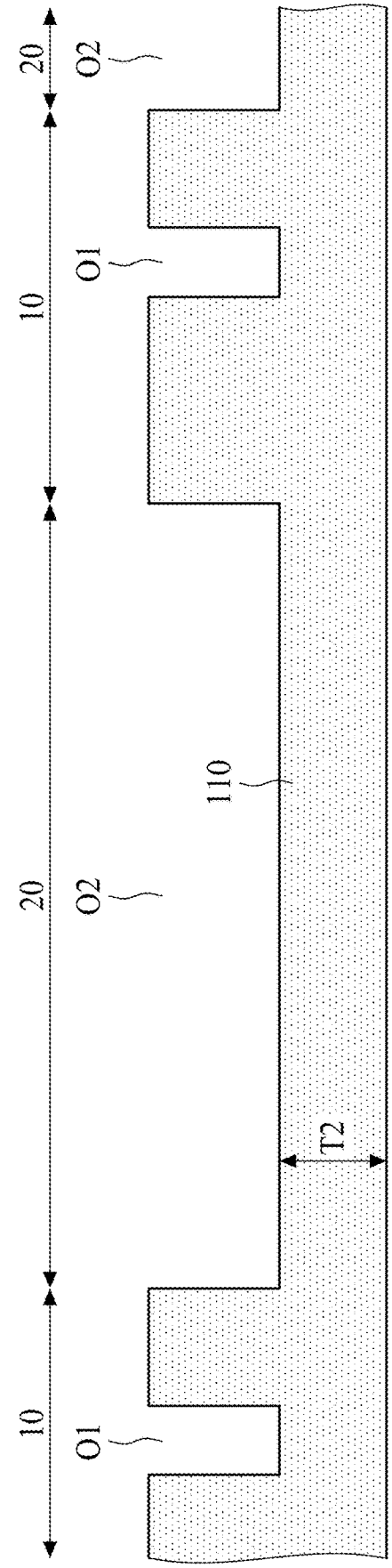

SEMICONDUTOR PACKAGE STRUCTURES AND METHODS OF MANUFACTURING THE SAME

BACKGROUND

1. Field of the Disclosure

The present disclosure relates to semiconductor package structures and methods of manufacturing the same.

2. Description of Related Art

A semiconductor package structure can use conductive wires for electrical connection. However, the conductive wires, which can have relatively great conductive path, may adversely affect performance of the semiconductor package structure, which may operate in a high-speed or high-frequency environment.

SUMMARY

According to some embodiments of the present disclosure, a semiconductor package structure includes a first semiconductor device and a second semiconductor device. The first semiconductor device includes a substrate and a circuit. The substrate has a first portion and a second portion. The first thickness of the first portion is greater than the second thickness of the second portion. The circuit is disposed on the second portion of the substrate. The second semiconductor device is disposed on the circuit of the first semiconductor device.

According to some embodiments of the present disclosure, a semiconductor package structure includes a first semiconductor device and a second semiconductor device. The first semiconductor device has a substrate. The substrate has a first surface at a first elevation and a second surface at a second elevation less than the first elevation. The second semiconductor device is disposed on the second surface of the substrate of the first semiconductor device.

According to some embodiments of the present disclosure, a method of manufacturing a semiconductor package structure includes: removing a part of a substrate to form a first portion and a second portion so that a first thickness of the first portion is greater than a second thickness of the second portion; forming a circuit on the second portion of the substrate; and disposing a semiconductor device on the circuit.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M and FIG. 4N illustrate various stages of a method for manufacturing a semiconductor package structure in accordance with some embodiments of the present disclosure.

Figure 1A:
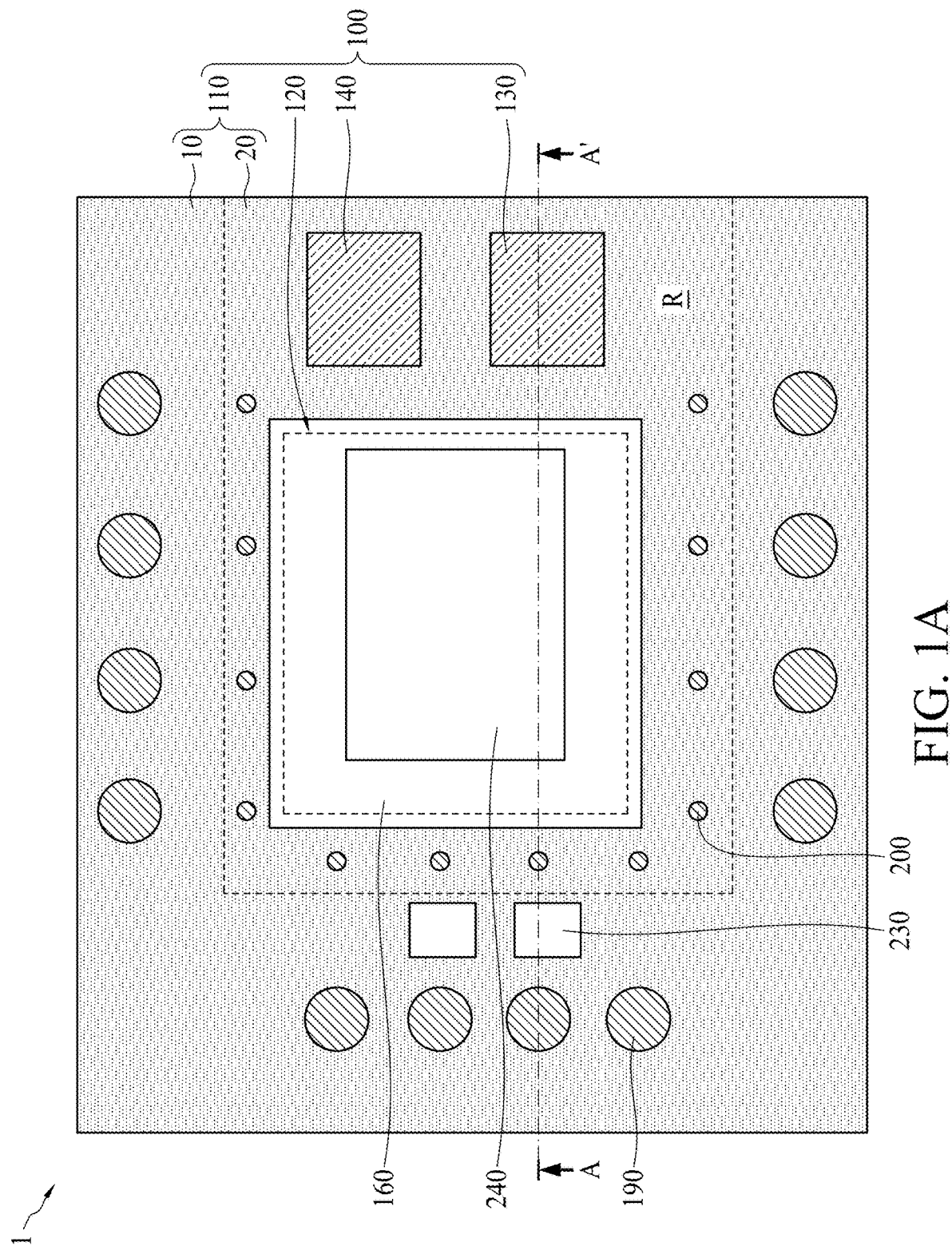
FIG. 1A is a top view of a semiconductor package structure in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides for many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Figure 1B:
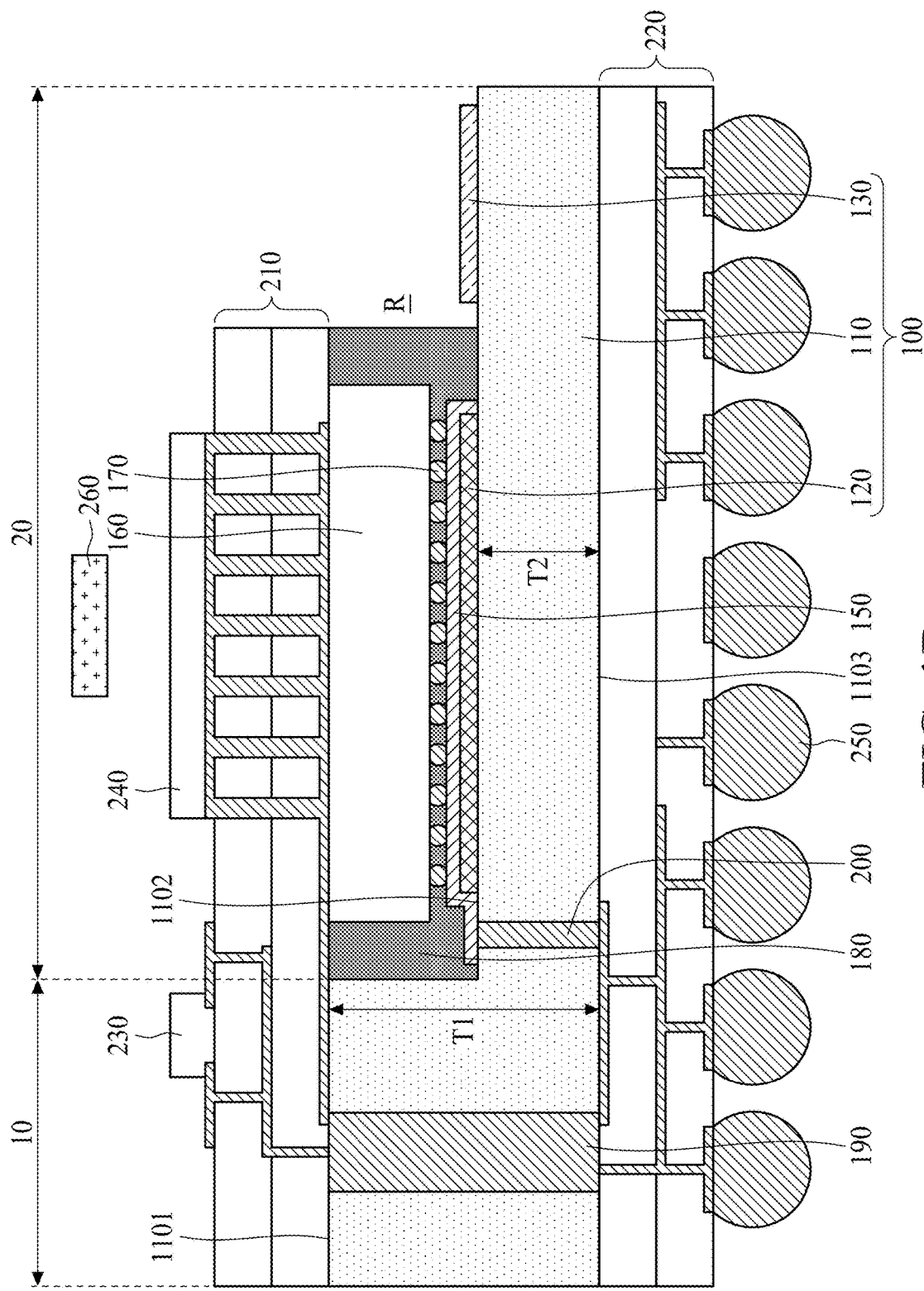
FIG. 1B is cross-sectional view of the semiconductor package structure 1 across line A-A' as shown in FIG. 1A.

FIG. 1A is a top view of a semiconductor package structure 1 in accordance with some embodiments of the present disclosure. FIG. 1B is a cross-sectional view of the semiconductor package structure 1 across line A-A' as shown in FIG. 1A.

FIG. 1A briefly illustrates the layout of the semiconductor package structure 1, from which some elements are omitted for brevity, wherein the elements shown in FIG. 1A will be described in detail later. As shown in FIG. 1A, the semiconductor package structure 1 includes a semiconductor device 100, a semiconductor device 160, through-silicon vias (TSVs) 190, TSVs 200, passive elements 230 and a heat sink 240.

The semiconductor device 100 can include a substrate 110, a circuit 120 (can also be referred to as a circuit layer), a light receiver 130 and a light emitter 140.

In some embodiments, the substrate 110 can include a first portion 10 and a second portion 20. The second portion 20 can abut the first portion 10. In some embodiments, the first portion 10 has a thickness thicker than or exceeding that of the second portion 20. That is, the second portion 20 can correspond to a recess R of the substrate 110.

The first portion 10 can have, but is not limited to, a U-shaped profile or a C-shaped profile. The second portion 20 can have, but is not limited to, a rectangular profile. In other embodiments, the first portion 10 can have a ring-shaped profile surrounding the second portion 20.

As shown in FIG. 1A, the circuit 120 is disposed on the second portion 20 of the substrate 110. The circuit 120 is disposed on the recess R of the substrate 110. The light receiver 130 is disposed on the second portion 20 of the substrate 110. The light receiver 130 is disposed on the recess R of the substrate 110. The light emitter 140 is disposed on the second portion 20 of the substrate 110. The light emitter 140 is disposed on the recess R of the substrate 110.

In some embodiments, the semiconductor device 160 is disposed on the substrate 110 of the semiconductor device 100. In some embodiments, the semiconductor device 160 is disposed on the second portion 20 of the substrate 110. In some embodiments, the semiconductor device 160 is disposed on the recess R of the substrate 110.

In some embodiments, the TSVs 190 are disposed on the first portion 10 of the substrate 110. In some embodiments, the TSVs 200 are disposed on the second portion 20 of the substrate 110.

The passive elements 230 are disposed on the first portion 10 of the substrate 110. In other embodiments, the passive elements 230 are disposed on the second portion 20 of the substrate 110.

The heat sink 240 is disposed on the second portion 20 of the substrate 110. In other embodiments, the heat sink 240 is disposed on the first portion 10 of the substrate 110.

Referring to FIG. 1B, the semiconductor package structure 1 includes the semiconductor device 100. The semiconductor device 100 can be configured to process, receive, and/or transmit optical signals. The semiconductor device 100 can convert the optical signals to electric signals. For example, the semiconductor device 100 can include, but is not limited to, a photonic integrated circuit (PIC).

The semiconductor device 100 can include the substrate 110. The substrate 110 can include a bulk silicon substrate and/or other suitable material. For example, the substrate 110 may include a buried oxide layer (not shown) formed over the substrate to form an SOI (silicon on insulator) structure.

In some embodiments, the semiconductor device 100 includes the first portion 10 and the second portion 20. The first portion 10 has a thickness T1. The second portion 20 has a thickness T2. In some embodiments, the thickness T1 is greater than the thickness T2. For example, the thickness T1 can be in a range from about 500 μm to about 600 μm; the thickness T1 can be in a range from about 600 μm to about 700 μm; the thickness T1 can be in a range from about 700 μm to about 800 μm. The thickness T2 can be in a range from about 250 μm to about 300 μm; the thickness T2 can be in a range from about 300 μm to about 350 μm; the thickness T2 can be in a range from about 350 μm to about 400 μm; the thickness T2 can be in a range from about 400 μm to about 450 μm.

In some embodiments, the difference between the thickness T1 and the thickness T2 can be in a range from about 250 μm to about 300 μm; the difference between the thickness T1 and the thickness T2 can be in a range from about 300 μm to about 350 μm; the difference between the thickness T1 and the thickness T2 can be in a range from about 350 μm to about 400 μm. In some cases, the thickness T2 is less than half of the thickness T1.

The substrate 110 can include a surface 1101, a surface 1102 and a surface 1103. For example, the surface 1101 can correspond to the first portion 10. The surface 1102 can correspond to the second portion 20. The surface 1101 and the surface 1103 can be located in two opposite sides of the substrate 110. The surface 1102 and the surface 1103 can be located in two opposite sides of the substrate 110. The surface 1101 and the surface 1102 can be located in the same side of the substrate 110. The surfaces 1101, 1102 and 1103 may substantially be parallel to each other.

The surface 1101 can have a first elevation; the surface 1102 can have a second elevation; the surface 1103 can have a third elevation. The first elevation is greater than or exceeds the second elevation. The second elevation is greater than or exceeds the third elevation.

The semiconductor device 100 can include the circuit 120. The circuit 120 is disposed on the second portion 20 of the substrate 110. The circuit 120 is disposed on the surface 1102 of the substrate 110. The circuit 120 can include one or more active elements. The active elements may include, but are not limited to, diodes, field effect transistors (FETs), metal-oxide-semiconductor FETs (MOSFETs), complementary metal-oxide-semiconductor (CMOS) transistors, and bipolar transistors. The circuit 120 can include one or more passive elements. The passive elements can include, but are not limited to, resistors, capacitors, and inductors.

The semiconductor device 100 can include the light receiver 130. In some embodiments, the light receiver 130 is disposed on the second portion 20 of the substrate 110. The light receiver 130 is disposed on the surface 1102 of the substrate 110. The light receiver 130 can be configured to, but is not limited to, receive light from other elements (not shown), such as an optical fiber. The light receiver 130 can include, but is not limited to, an edge coupler, a surface coupler or other couplers. For example, the light receiver 130 can include a grate structure, which may include a silicon layer, a silicon oxide layer and/or other suitable material.

The semiconductor device 100 can include the light emitter 140 (shown in FIG. 1A). In some embodiments, the light emitter 140 is disposed on the second portion 20 of the substrate 110. The light emitter 140 is disposed on the surface 1102 of the substrate 110. The light emitter 140 can abut the light receiver 130. The light emitter 140 can be configured to, but is not limited to, emit light. The light emitter 140 can include, but is not limited to, an edge coupler, a surface coupler or other couplers. For example, the light emitter 140 can include a grate structure, which may include a silicon layer and a silicon oxide layer and/or other suitable material.

The semiconductor package structure 1 includes a redistribution layer (RDL) 150. The RDL 150 can be disposed on the second portion 20 of the substrate 110. The RDL 150 can be disposed on the circuit 120 of the semiconductor device 100. The RDL 150 is configured to electrically connect the semiconductor device 100 and other element(s), such as a semiconductor device 160. The RDL 150 can include multiple dielectric layers, conductive layers and via formed therein.

The semiconductor package structure 1 includes the semiconductor device 160. In some embodiments, the semiconductor device 160 is disposed on the second portion 20 of the substrate 110. In some embodiments, the semiconductor device 160 is disposed on the circuit 120 of the semiconductor device 100. The semiconductor device 160 can be disposed on the RDL 150. The semiconductor device 160 can be configured to process, receive, and/or transmit electrical signals from other elements, such as the semiconductor device 100. For example, the semiconductor device 160 can include, but is not limited to, an electronic integrated circuit (EIC).

The semiconductor package structure 1 includes a plurality of bumps 170. The bumps 170 can be mounted on the semiconductor device 160. The bumps 170 are configured to electrically connect the semiconductor device 100 and the semiconductor device 160. The bumps 170 can include a solder ball (e.g., Sn ball).

The semiconductor package structure 1 includes a package body 180. In some embodiments, the package body 180 is disposed on the second portion 20 of the substrate 110. In some embodiments, the package body 180 covers a portion of the surface 1102. The package body 180 can encapsulate the semiconductor device 160. The package body 180 can cover or surround the circuit 120, the RDL 150 and/or the semiconductor device 160. The light receiver 130 and the light emitter 140 can be exposed from the package body 180. The package body 180 is made of molding material that may include, for example, a Novolac-based resin, an epoxy-based resin, a silicone-based resin, or other another suitable encapsulant. Suitable fillers may also be included, such as powdered $SiO_2$.

The semiconductor package structure 1 includes multiple TSVs 190. In some embodiments, the TSVs 190 are disposed on the first portion 10 of the substrate 110. In some embodiments, the TSVs 190 extend from the surface 1101 to the surface 1103 of the substrate 110. The material of the TSVs 190 may include copper (Cu), tin (Sn), silver (Ag), nickel (Ni), or a combination of two or more thereof. In some embodiments, the length of the TSVs 190 can be equivalent to the thickness T1. That is, the length of the TSVs 190 can be in a range from about 500 μm to about 600 μm; the length of the TSVs 190 can be in a range from about 600 μm to about 700 μm; the length of the TSVs 190 can be in a range from about 700 μm to about 800 μm.

The semiconductor package structure 1 includes multiple TSVs 200. In some embodiments, the TSVs 200 are disposed on the second portion 20 of the substrate 110. In some embodiments, the TSVs 200 extend from the surface 1102 to the surface 1103 of the substrate 110. The material of the TSVs 200 may include copper (Cu), tin (Sn), silver (Ag), nickel (Ni), or a combination of two or more thereof. Each of the TSVs 200 can be electrically connected to the corresponding TSVs 190. The length of the TSVs 200 can be equivalent to the thickness T2. That is, the length of the TSVs 200 can be in a range from about 250 μm to about 300 μm; the length of the TSVs 200 can be in a range from about 300 μm to about 350 μm; the length of the TSVs 200 can be in a range from about 350 μm to about 400 μm; the length of the TSVs 200 can be in a range from about 400 μm to about 450 μm. In some embodiments, the length of the TSVs 200 can be less than that of the TSVs 190.

The semiconductor package structure 1 includes a redistribution layer (RDL) 210. The RDL 210 is disposed on the surface 1101 of the substrate 110. The RDL 210 is disposed on the semiconductor device 160. The semiconductor device 160 can include multiple dielectric layers, conductive layers and via formed therein.

The semiconductor package structure 1 includes a RDL 220. The RDL 220 is disposed on the surface 1103 of the substrate 110. In some embodiments, the RDL 210 and the RDL 220 are disposed on different sides of the substrate 110. The RDL 220 can include multiple dielectric layers, conductive layers and via formed therein.

The semiconductor package structure 1 includes the passive element 230. The passive element 230 is disposed on the RDL 210. The passive element 230 is electrically connected to the TSVs 190 through the RDL 210. The passive element 230 can include, but is not limited to, resistor(s), capacitor(s), and inductor(s).

The semiconductor package structure 1 includes the heat sink 240. The heat sink 240 is disposed on the second portion 20 of the substrate 110. The heat sink 240 is disposed on the RDL 210. The heat sink 240 can include, but is not limited to, a solid metal slug or an electrical insulator coated with metallic film. For example, the heat sink 240 can include copper (Cu), aluminum (Al) and/or other suitable materials. The heat sink 240 can also include aluminum oxide ($Al_2O_3$), aluminum nitride (AlN), or silicon nitride (SiN) plate coated with copper.

The semiconductor package structure 1 includes a plurality of bumps 250. The bumps 250 are disposed on the surface 1103 of the substrate 110. The bumps 250 can be mounted on another substrate (not shown), such as a printed circuit board (PCB). The bump 250 can include a solder ball (e.g., Sn ball). The passive element 230 can be electrically connected to the bumps 250 through the RDL 210, the TSVs 190 and the RDL 220. The semiconductor device 160 can be electrically connected to the bumps 250 through the TSVs 200 and the RDL 220.

The semiconductor package structure 1 includes a fan 260. The fan 260 is configured to move cool air across the heat sink 240, evacuating hot air from the semiconductor package structure 1.

Figure 2:
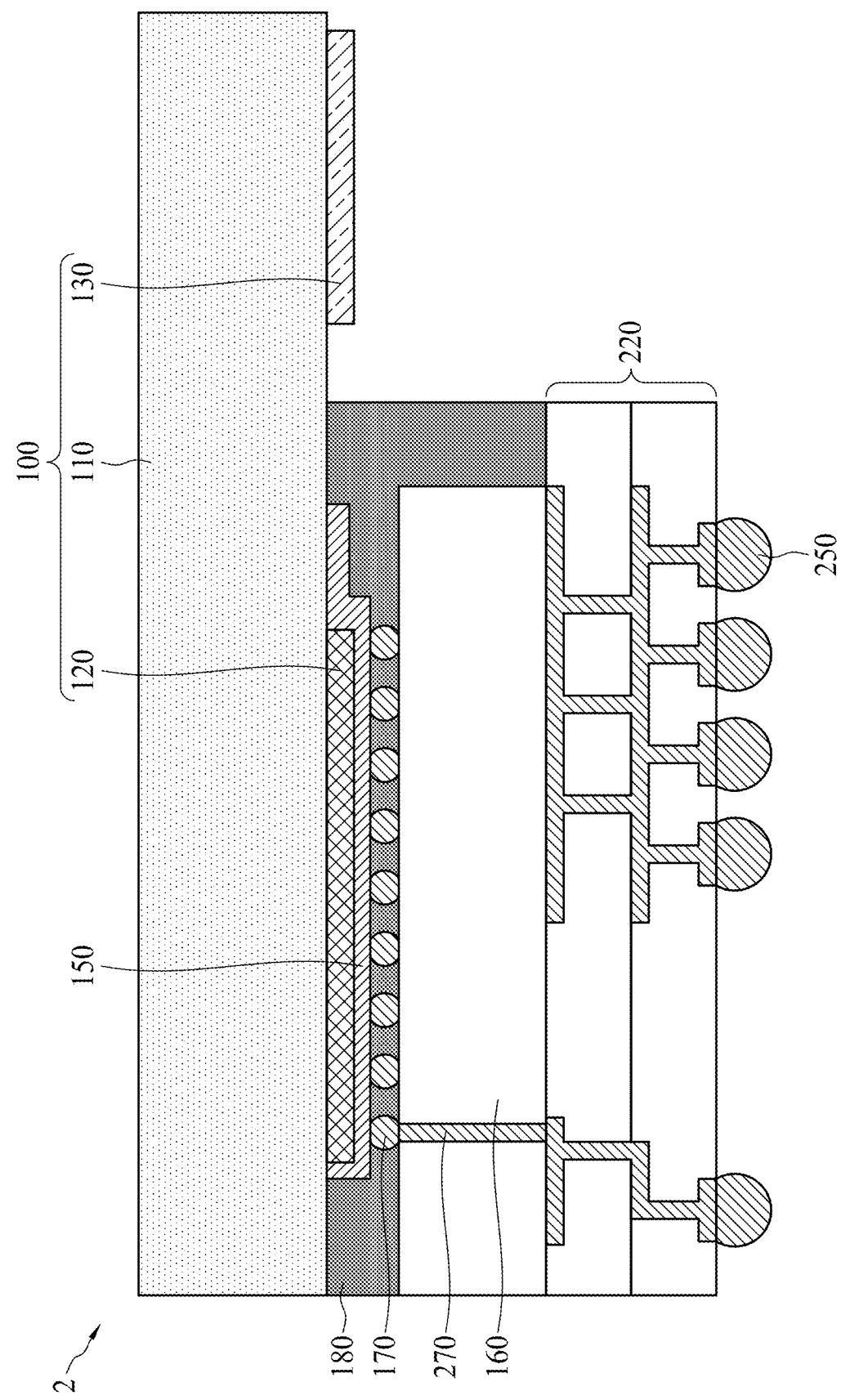
FIG. 2 is a cross-sectional view of another semiconductor package structure in accordance with some embodiments of the present disclosure.

Referring to FIG. 2, FIG. 2 is a cross-sectional view of semiconductor package structure 2 in accordance with some embodiments of the present disclosure. The semiconductor package structure 2 of FIG. 2 has a similar structure to that of the semiconductor package structure 1 of FIG. 1B except with regard to TSV(s) 270.

The semiconductor package structure 2 has the TSV(s) 270 formed in the substrate of the semiconductor device 160, such as an EIC die. The material of the TSV 270 may include copper (Cu), tin (Sn), silver (Ag), nickel (Ni), or a combination of two or more thereof. The semiconductor device 100 can be electrically connected to the bumps 250 through the RDL 150, the bumps 170, the TSV 270, and the RDL 220.

Figure 3:
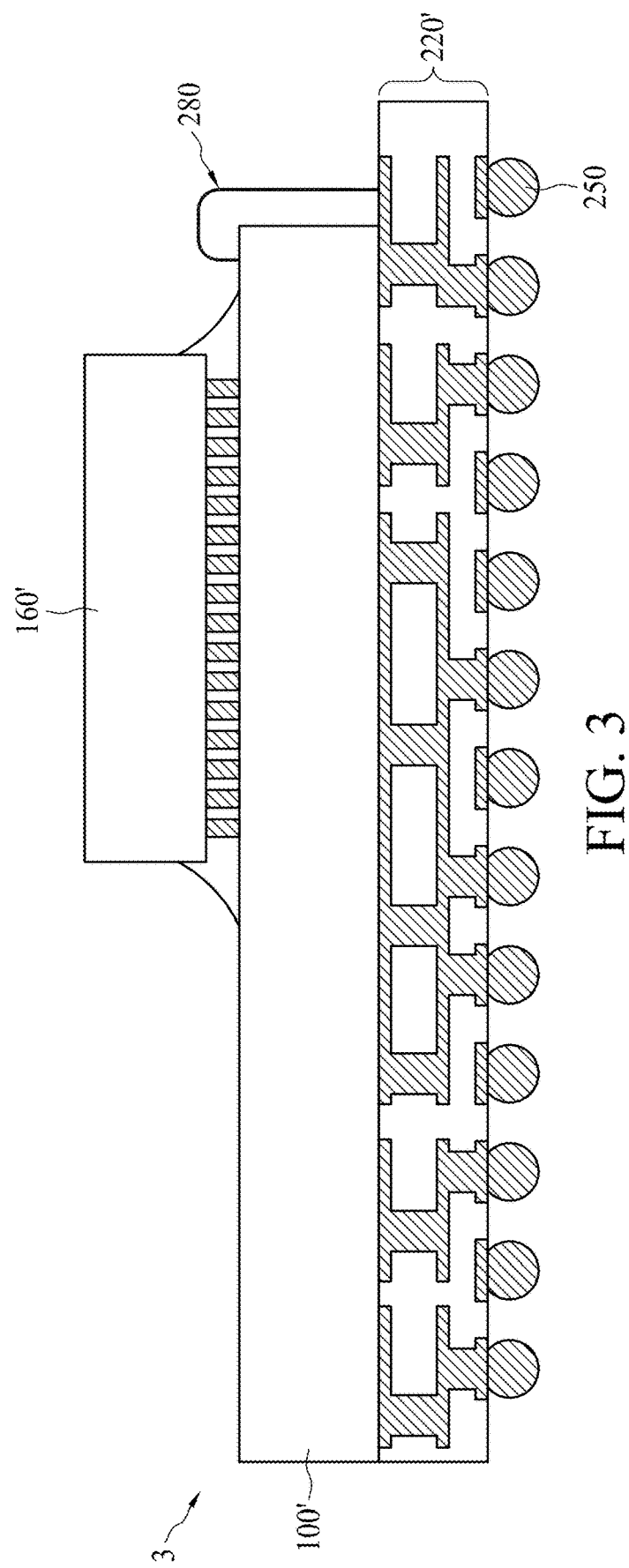
FIG. 3 is a cross-sectional view of a semiconductor package structure of a comparative example.

FIG. 3 is a cross-sectional view of a semiconductor package structure 3 of a comparative example. As shown in FIG. 3, the semiconductor package structure 3 includes a semiconductor device 100', a semiconductor device 160', a RDL 220' and a plurality of bumps 250. The semiconductor device 100' may be similar to or the same as the semiconductor device 100; the semiconductor device 160' may be similar to or the same as the semiconductor device 160; the RDL 220' may be similar to or the same as the RDL 220.

As shown in FIG. 3, the semiconductor device 160' is electrically connected to the bumps 250 through a conductive wire 280 and the RDL 220'. The conductive wire 280, a metal trace out of the semiconductor device 100', is configured to electrically connect the semiconductor device 160' and the RDL 220'. The conductive path between the semiconductor device 160' and the bumps 250 exceeds the thickness of the substrate of the semiconductor device 100'.

Compared to the semiconductor package structure 3, the semiconductor package structure 1 uses the TSVs 200 to replace the conductive wire 280. The TSVs 200 are formed in the substrate 110 of the semiconductor device 100, providing a shorter conductive path to connect the semiconductor device 160 and the bumps 250. Moreover, the TSVs 200 are formed in a thinned portion (e.g., the second portion 20) of the substrate 110 so that the length of the TSVs 200 can be further reduced. Compared to the semiconductor package structure 3, the conductive path between the semiconductor device 160 and the bumps 250 of the semiconductor package structure 1 can be reduced by 300 μm or more. In some cases, the conductive path between the semiconductor device 160 and the bumps 250 of the semiconductor package structure 1 is less than half of that between the semiconductor device 160' and the bumps 250 of the semiconductor package structure 3. Since impedance is proportional to a conductive path, the impedance of the semiconductor package structure 1 can be less than half of that of the semiconductor package structure 3. Accordingly, the semiconductor package structure 1 can work efficiently in a high-speed or high-frequency environment.

Further, in addition to the thinner portion (e.g., the second portion 20), the substrate 110 also includes a thicker portion (e.g., the first portion 10) so that the substrate 110 can have enough rigidity, which can prevent the semiconductor package structure 1 from breaking during some processes, such as a reflow process or other processes.

FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M and FIG. 4N illustrate various stages of a method for manufacturing the semiconductor package structure 1 in accordance with some embodiments of the present disclosure.

Referring to FIG. 4A, a substrate 110 is provided. The substrate 110 can have the thickness T1. The thickness T1 can be in a range from about 500 μm to about 600 μm; the thickness T1 can be in a range from about 600 μm to about 700 μm; the thickness T1 can be in a range from about 700 μm to about 800 μm.

Referring to FIG. 4B, an etching process is performed on the substrate 110 to define the first portion 10 and the second portion 20. A portion of the substrate 110 is removed to form openings O1 and openings O2. The opening O1 is formed in the first portion 10; the opening O2 is formed in the second portion 20. The opening O2 has a aperture greater than that of the opening O1. The thinned substrate 110 has a thickness T2. The thickness T2 can be in a range from about 250 μm to about 300 μm; the thickness T2 can be in a range from about 300 μm to about 350 μm; the thickness T2 can be in a range from about 350 μm to about 400 μm; the thickness T2 can be in a range from about 400 μm to about 450 μm. The etching process can include dry etching, wet etching and/or other suitable etching process.

Figure 4C:
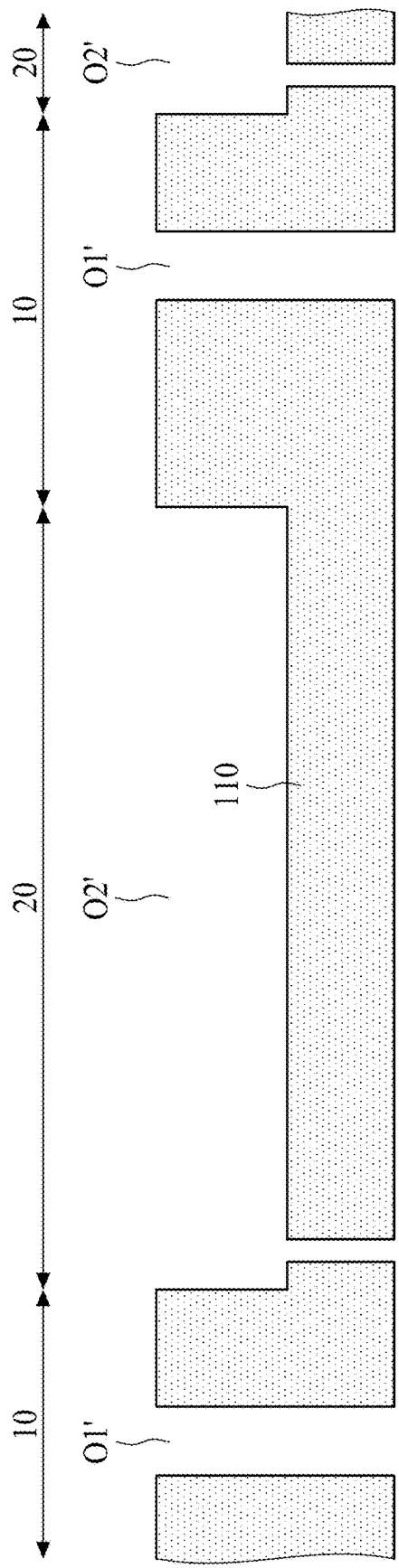

Referring to FIG. 4C, an etching process is performed on the substrate 110 to form openings O1' and openings O2'. A portion of the substrate 110 is removed so that the substrate 110 can have through-holes formed in the first portion 10 and in the second portion 20, respectively.

Figure 4D:
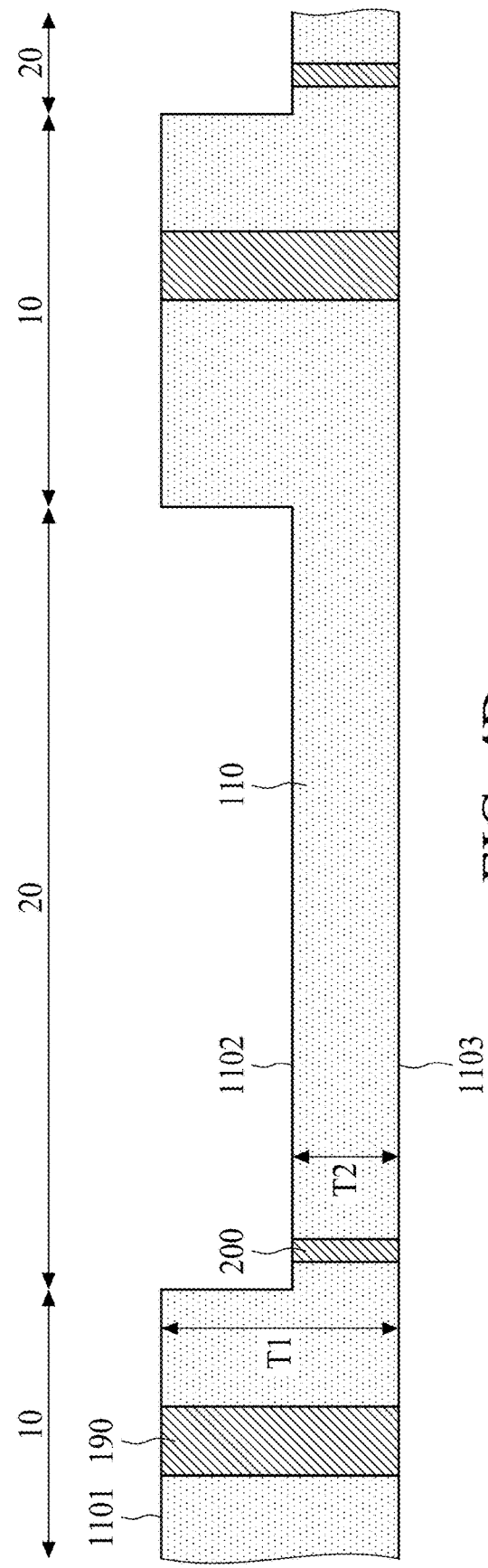

Referring to FIG. 4D, a plating process is performed to form the TSVs 190 and the TSVs 200. The TSV 190 is formed in the first portion 10. The TSV 190 extends from the surface 1101 to the surface 1102. The TSV 200 is formed in the second portion 20. The TSV 200 extends from the surface 1102 to the surface 1103. The length of the TSV 190 can substantially be equivalent to the thickness of the first portion 10 of the substrate 110. The length of the TSVs 190 can be in a range from about 500 μm to about 600 μm; the length of the TSVs 190 can be in a range from about 600 μm to about 700 μm; the length of the TSVs 190 can be in a range from about 700 μm to about 800 μm. The length of the TSVs 200 can substantially be equivalent to the thickness of the second portion 20 of the substrate 110. The length of the TSVs 200 can be in a range from about 300 μm to about 350 μm; the length of the TSVs 200 can be in a range from about 350 μm to about 400 μm; the length of the TSVs 200 can be in a range from about 400 μm to about 450 μm.

Before the plating process, a buffer layer (not shown) can be formed on sidewalls of the substrate 110, and a seed layer (not shown) can be formed on the silicon dioxide layer by a sputtering process. For example, the buffer layer can include silicon dioxide, silicon nitride, silicon oxynitride or other suitable material; the seed layer can include titanium (Ti), copper (Cu), tin (Sn), stainless steel, metal alloy, or other suitable materials.

Figure 4E:
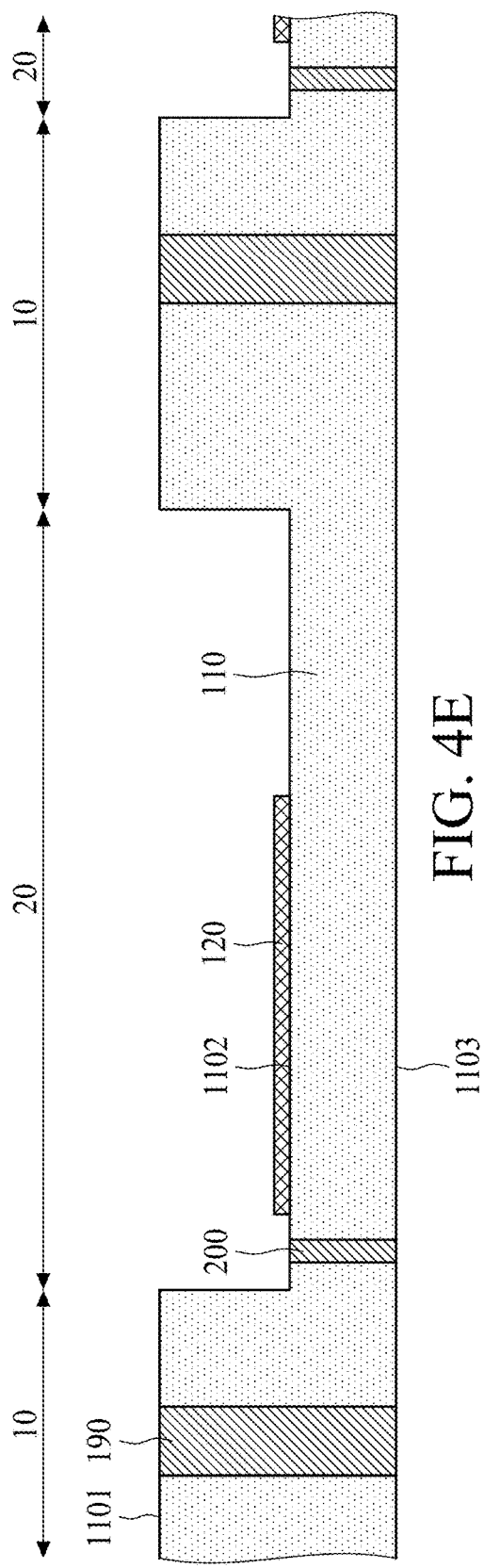

Referring to FIG. 4E, the circuit 120 is formed on the surface 1102. The circuit 120 can include multiple active elements and/or passive elements. In some embodiments, the circuit 120 can include optical sensitive layer(s), which can absorb, receive, emit, and/or transmit photons.

Figure 4F:
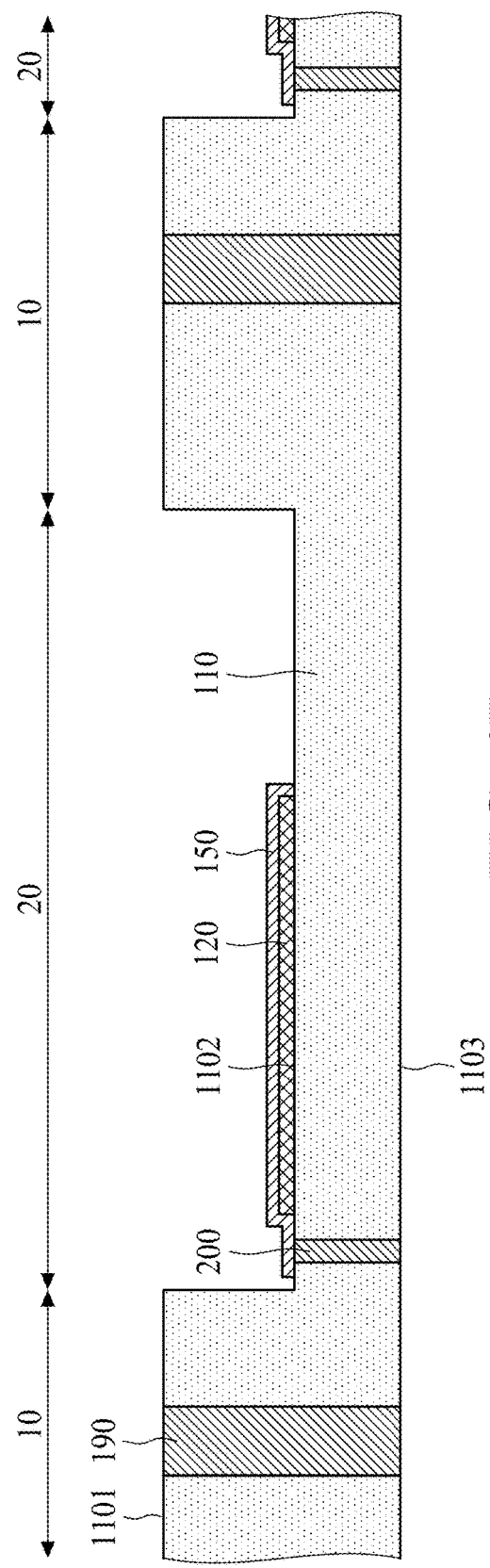

Referring to FIG. 4F, the RDL 150 is formed on the circuit 120. The RDL 150 can cover the circuit 120 and the TSVs 200. The RDL 150 can include multiple dielectric layers and metal trace formed therein.

Figure 4G:
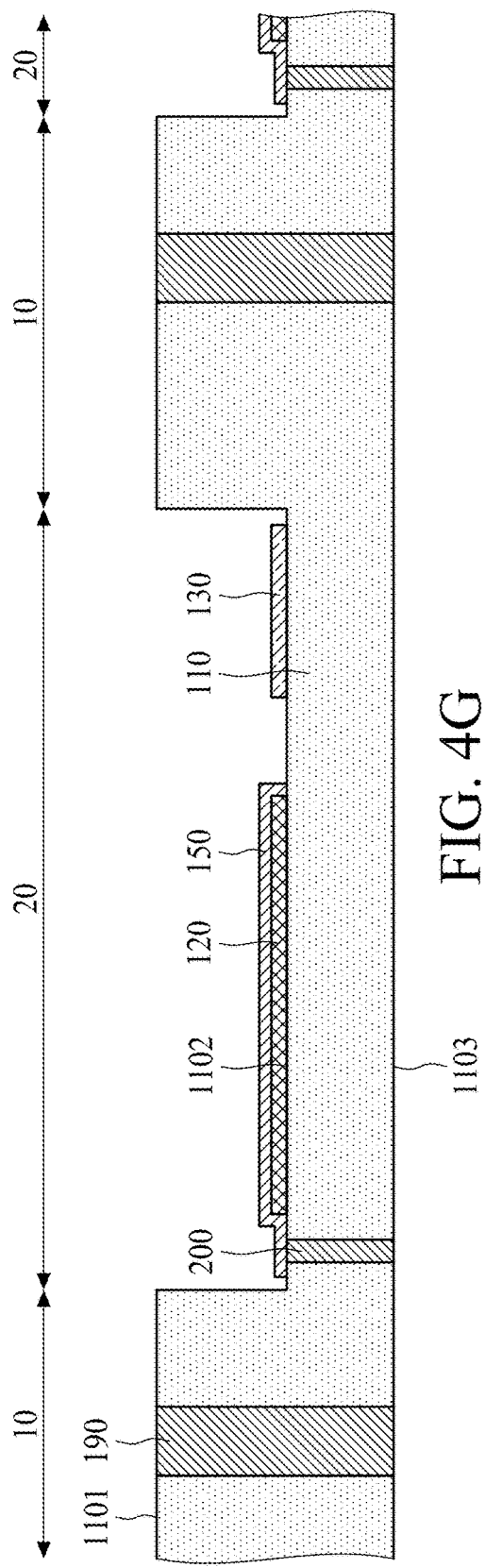

Referring to FIG. 4G, the light receiver 130 and the light emitter 140 (not shown in this cross-section) are formed on the surface 1102. In some examples, a silicon layer is deposited on the buried oxide layer (not shown), and an etching process is performed to form multiple recesses in the silicon layer. Then, a silicon dioxide layer is deposited on the silicon layer filling the recesses to form the grate structure.

Figure 4H:
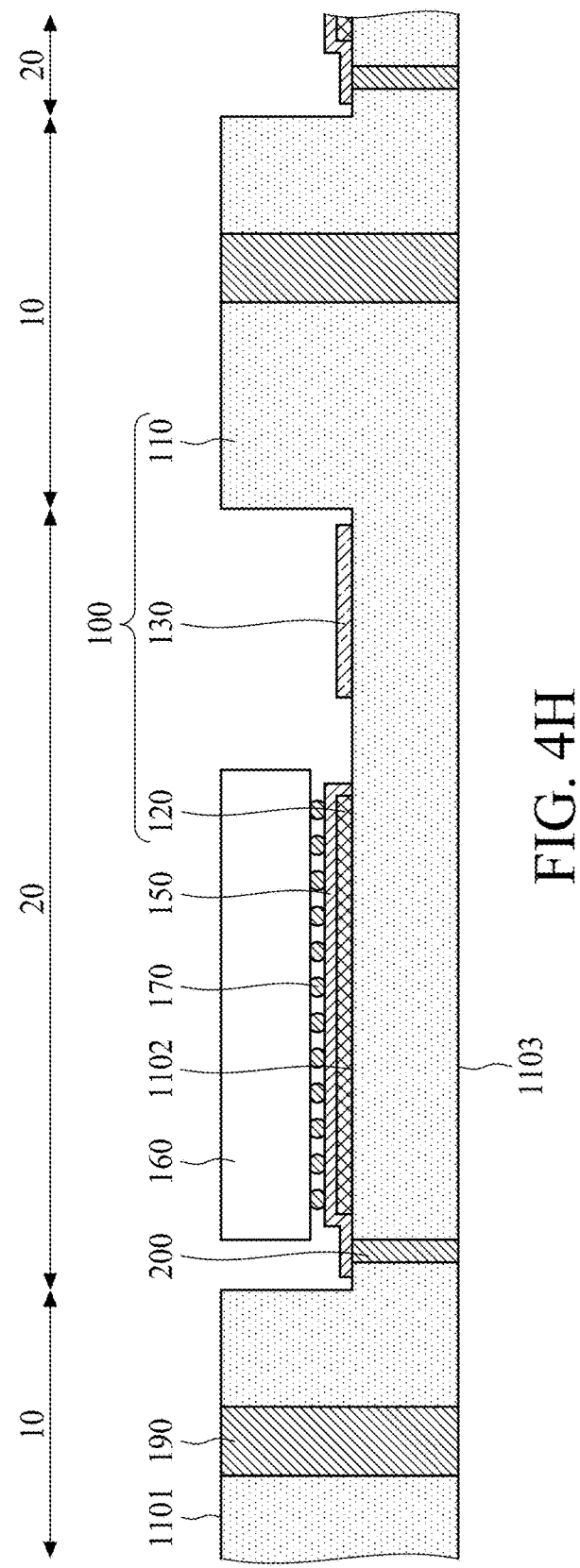

Referring to FIG. 4H, the semiconductor device 160 and the bumps 170, mounted on the semiconductor device 160, are attached on the semiconductor device 100. The semiconductor device 160 can be electrically connected to the semiconductor device 100 through the bumps 170 and the RDL 150. The semiconductor device 160 can be disposed on the semiconductor device 100 by a flip chip process or other suitable processes.

Figure 4I:
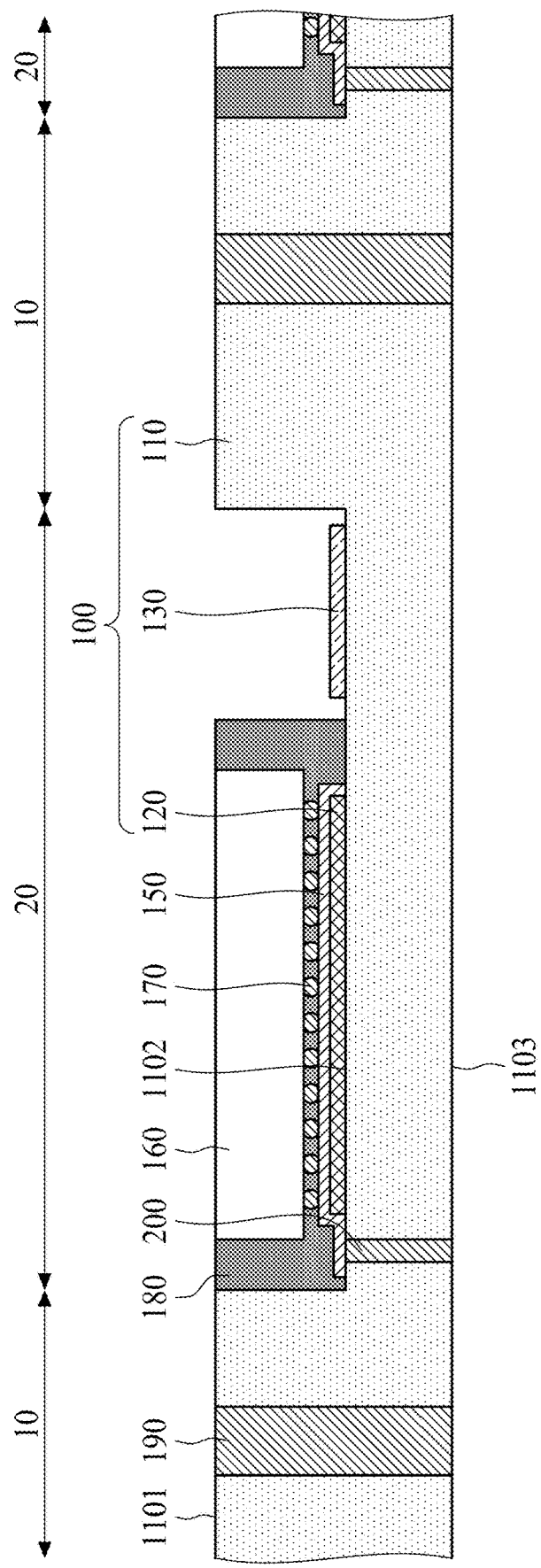

Referring to FIG. 4I, the package body 180 is formed to encapsulate the semiconductor device 160. In some examples, a molding compound can be coated on the surface 1101 and the surface 1102 of the substrate 110, and then the molding compound is grinded so that the package body 180 may have a top surface coplanar with the surface 1101.

Figure 4J:
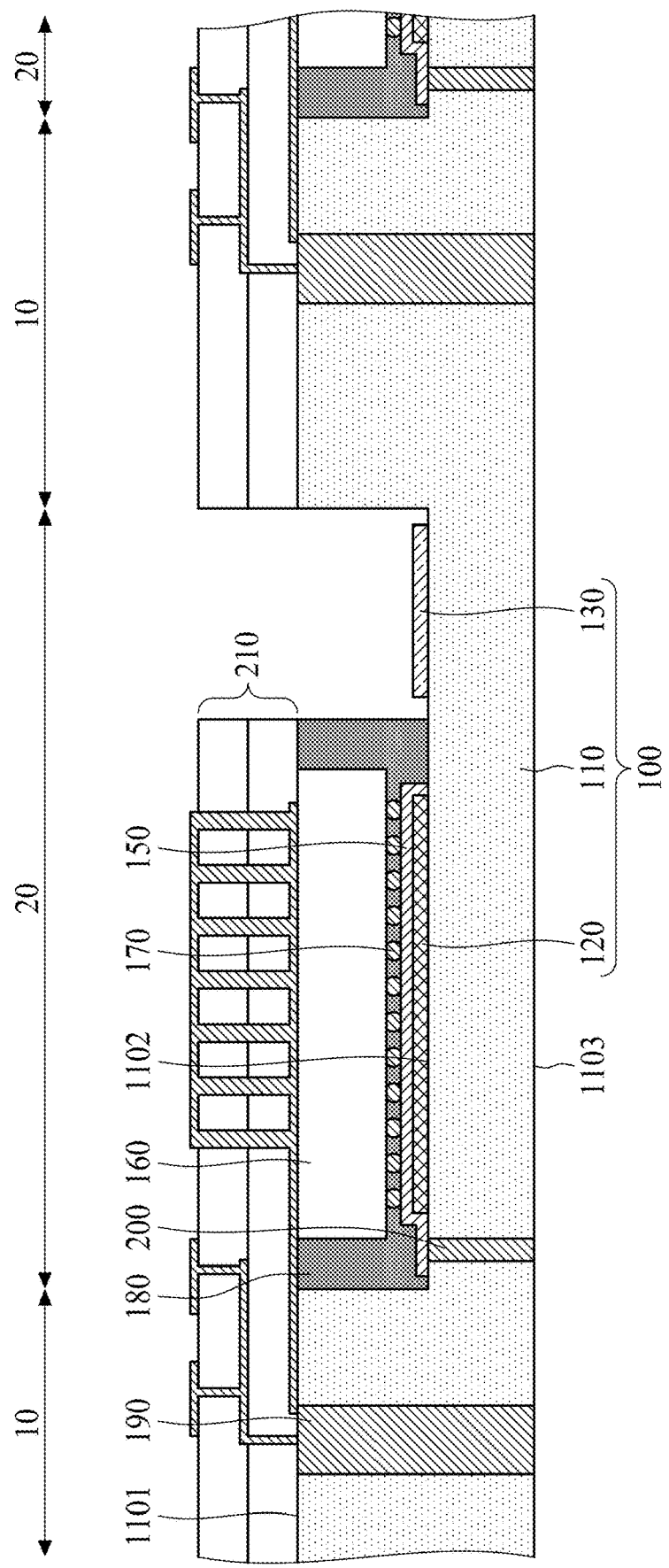

Referring to FIG. 4J, the RDL 210 is formed on the surface 1101 and the package body 180. The RDL 210 can have metal traces formed on the top surface thereon to serve as metal pad(s).

Figure 4K:
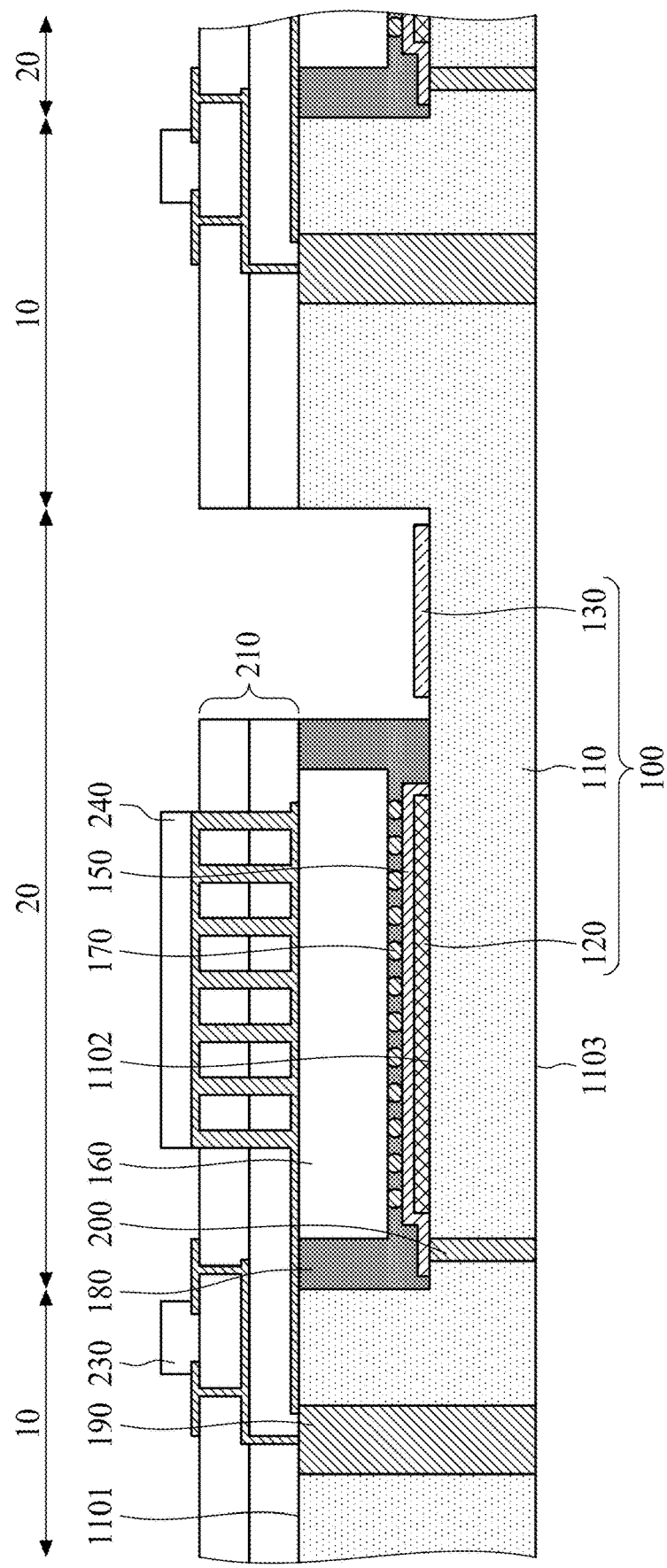

Referring to FIG. 4K, the passive element 230 and the heat sink 240 are formed on the RDL 210. The heat sink 240 can correspond to a fan area of the semiconductor package structure 1.

Figure 4L:
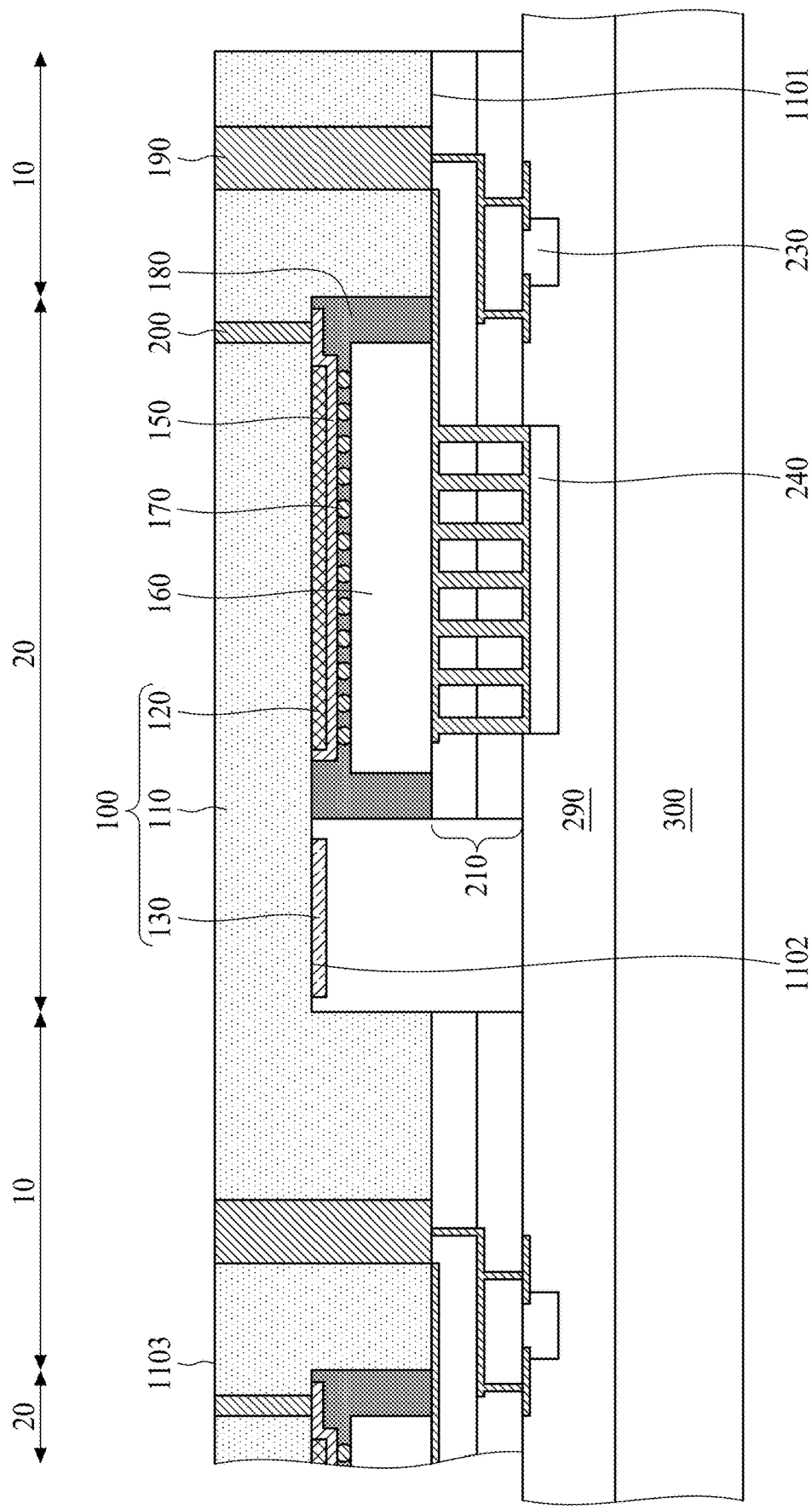

Referring to FIG. 4L, a carrier substrate 300 is provided. The carrier substrate 300 is used to support the substrate 110 and can be removed in subsequent process. The substrate 110 is turned over and attached to the carrier substrate 300 through an adhesive layer 290. The adhesive layer 290 can include a die attach film (DAF). For example, the adhesive layer 290 may include one or more epoxy resins. The carrier substrate 300 can include a glass substrate, a ceramic substrate, a polymer substrate or other suitable substrate.

Figure 4M:
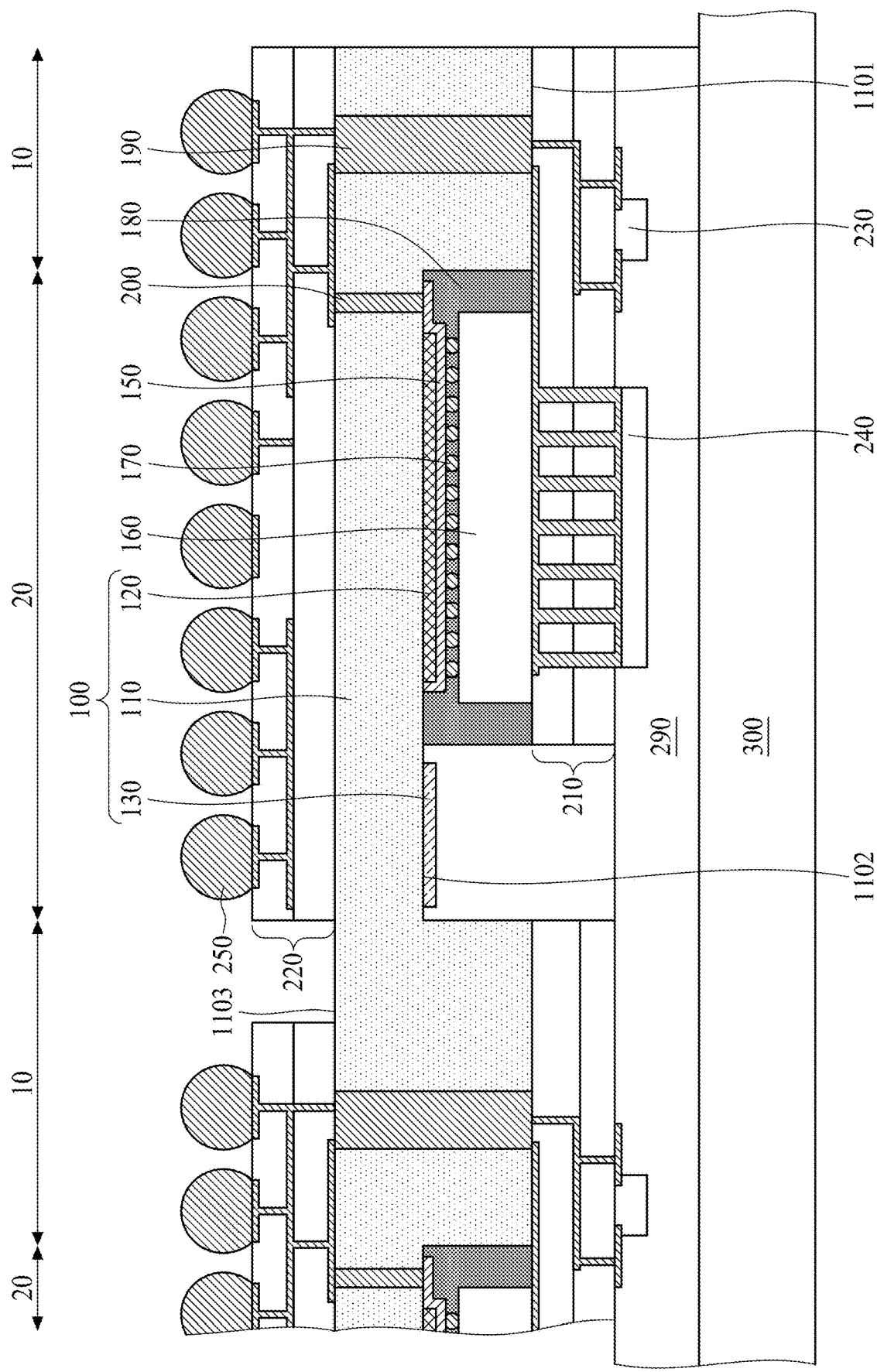

Referring to FIG. 4M, the RDL 220 is formed on the surface 1103 of the substrate 110, and then a reflow process is performed to form the bumps 250. Since there are different layers (e.g., the RDL 210 and the RDL 220) formed on two opposite sides of the substrate 110, warpage of the substrate 110 becomes much greater, which can cause the substrate 110 to break. According to some embodiments of the present disclosure, the substrate 110 has a thicker portion, such as the first portion 10, providing sufficient rigidity, to prevent the substrate 110 from breaking during the formation of the RDL 220 and/or the bumps 250.

Figure 4N:
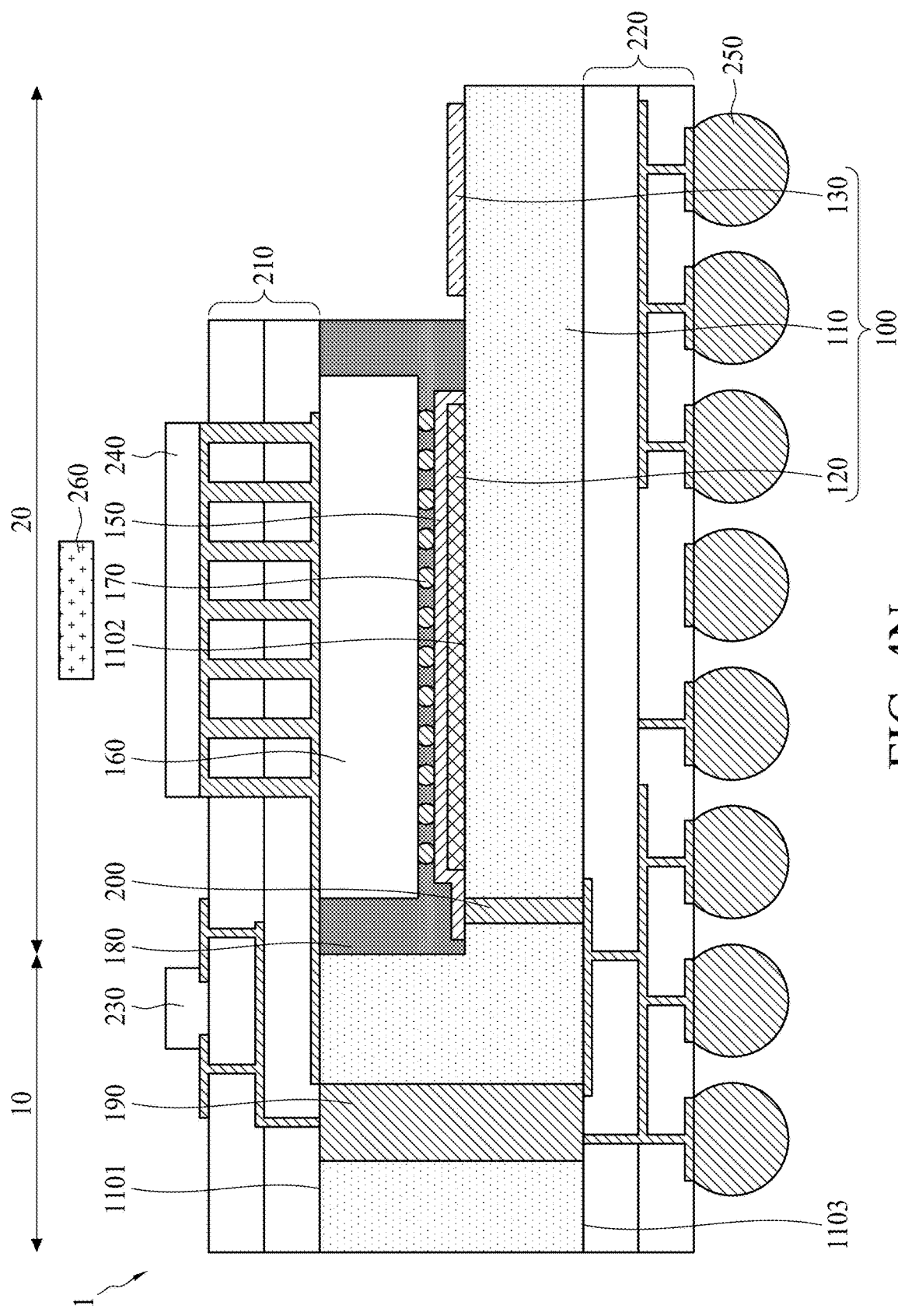

Referring to FIG. 4N, the adhesive layer 290 and the carrier substrate 300 are removed, and a singulation process is performed to separate and produce multiple semiconductor package structures 1.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only and that practical implementations of the structures described herein can be spatially arranged in any orientation or manner, provided that the merits of embodiments of this disclosure are not deviated from by such an arrangement.

As used herein, the term "vertical" is used to refer to these upward and downward directions, whereas the term "horizontal" refers to directions transverse to the vertical directions.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between the highest point and the lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
    a first semiconductor device, comprising:
        a substrate comprising a first portion and a second portion, wherein a first thickness of the first portion is greater than a second thickness of the second portion; and
        a circuit disposed on the second portion of the substrate;
    a second semiconductor device disposed on the circuit of the first semiconductor device;
    a first through silicon via (TSV) penetrating the second portion of the substrate; and
    a second TSV penetrating the first portion of the substrate.

2. The semiconductor package structure of claim 1, wherein the first semiconductor device further comprises:
    a light receiver disposed on the second portion of the substrate, and
    a light emitter disposed on the second portion of the substrate and abutting the light receiver.

3. The semiconductor package structure of claim 1, further comprising:
    a package body encapsulating the second semiconductor device.

4. The semiconductor package structure of claim 1, wherein the first portion of the substrate has a U-shaped profile from a top view.

5. The semiconductor package structure of claim 1, wherein a top surface of the first portion of the substrate is coplanar with a top surface of the second semiconductor device.

6. The semiconductor package structure of claim 1, further comprising:

a first redistribution layer (RDL) disposed on a first side of the substrate, wherein the second semiconductor device is separated from the first RDL through the substrate; and a plurality of bumps disposed on the first RDL.

7. The semiconductor package structure of claim 6, wherein the second semiconductor device is electrically connected to the plurality of bumps through the first TSV.

8. The semiconductor package structure of claim 6, further comprising:

a second redistribution layer (RDL) disposed on a second side of the substrate, wherein the second side is opposite to the first side.

9. The semiconductor package structure of claim 8, further comprising:

a passive element disposed on the second RDL.

10. The semiconductor package structure of claim 9, wherein the passive element is electrically connected to the plurality of bumps through the second TSV.

11. A semiconductor package structure, comprising:

a first semiconductor device having a substrate, the substrate having a first portion with a first surface at a first elevation and a second portion with a second surface at a second elevation less than the first elevation;

a second semiconductor device disposed on the second surface of the substrate of the first semiconductor device; and a package body encapsulating the second semiconductor device, wherein a portion of the second surface of the second portion of the substrate is exposed from the package body.

12. The semiconductor package structure of claim 11, wherein the substrate of the first semiconductor device has a recess on which the second semiconductor device is disposed.

13. The semiconductor package structure of claim 11, further comprising:

a first through silicon via (TSV) extending from the second surface and penetrating the substrate.

14. The semiconductor package structure of claim 13, further comprising:

a second through silicon via (TSV) extending from the first surface and penetrating the substrate.

15. The semiconductor package structure of claim 14, wherein a first length of the first TSV is less than a second length of the second TSV.

16. The semiconductor package structure of claim 14, further comprising:

a first redistribution layer (RDL) disposed on a third surface of the substrate, wherein the third surface is at a third elevation less than the second elevation, and the second semiconductor device is electrically connected to the first RDL through the first TSV.

17. The semiconductor package structure of claim 16, further comprising:

a second redistribution layer (RDL) disposed on the first surface of the substrate; and a passive element disposed on the second RDL, wherein the passive element is electrically connected to the first RDL through the second TSV.

18. A method for manufacturing a semiconductor package structure, comprising:

removing a part of a substrate to form a first portion and a second portion, wherein a first thickness of the first portion is greater than a second thickness of the second portion;

forming a circuit on the second portion of the substrate;

disposing a semiconductor device on the circuit; and forming a first through silicon via (TSV) in the first portion and a second TSV in the second portion, wherein a first length of the first TSV is greater than a second length of the second TSV.

19. The method of claim 18, wherein forming the first TSV and the second TSV comprises:

performing a first etching process so that the substrate has a first surface at a first elevation in the first portion and a second surface at a second elevation in the second portion, wherein the second elevation is less than the first elevation;

performing a second etching process to form a first opening extending from the first surface and a second opening extending from the second surface; and forming the first TSV in the first opening and the second TSV in the second opening.

* * * * *